(12) United States Patent
Yamamoto (10) Patent No.: US 6,271,085 B1
(45) Date of Patent: Aug. 7, 2001

(54) METHOD FOR FORMING A BOTTOM ELECTRODE OF A STORAGE CAPACITOR

(75) Inventor: Ichiro Yamamoto, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/761,692

(22) Filed: Jan. 18, 2001

(30) Foreign Application Priority Data

Jan. 26, 2000 (JP) .................................................. 12-017684

(51) Int. Cl.[7] ................................................ H01L 21/8242
(52) U.S. Cl. ............................................. 438/253; 438/255
(58) Field of Search ................................ 438/3, 238–240, 438/250–256, 293–399

(56) References Cited

U.S. PATENT DOCUMENTS 5,438,011 * 8/1995 Blalock et al. .

5,556,802 * 9/1996 Bakeman, Jr. et al. .

* cited by examiner

Primary Examiner—Jey Tsai
(74) Attorney, Agent, or Firm—Young & Thompson (57) ABSTRACT

The present invention provides a method of forming an electrode, comprising the steps of: forming a dummy electrode having an uneven side face; forming a template insulating film which completely buries the dummy electrode; removing the dummy electrode with leaving the template insulating film so as to form a hole in the template insulating film, wherein a shape of the uneven side face of the dummy electrode as removed is transferred to an inside wall of the hole; filling a metal film into the hole of the template insulating film, wherein the shape of the uneven inside wall of the hole is transferred to a side face of the metal film; and removing the template insulating film to form a metal electrode with an uneven side face.

10 Claims, 13 Drawing Sheets

METHOD FOR FORMING A BOTTOM ELECTRODE OF A STORAGE CAPACITOR

BACKGROUND OF THE INVENTION

The present invention relates to a method of forming a bottom electrode of a storage capacitor, and more particularly to a method of forming a bottom electrode of a storage capacitor in a semiconductor memory device such as a dynamic random access memory, wherein the storage capacitor has an increased capacity in unit area and shows a reduced leakage of current.

Figure 1A:
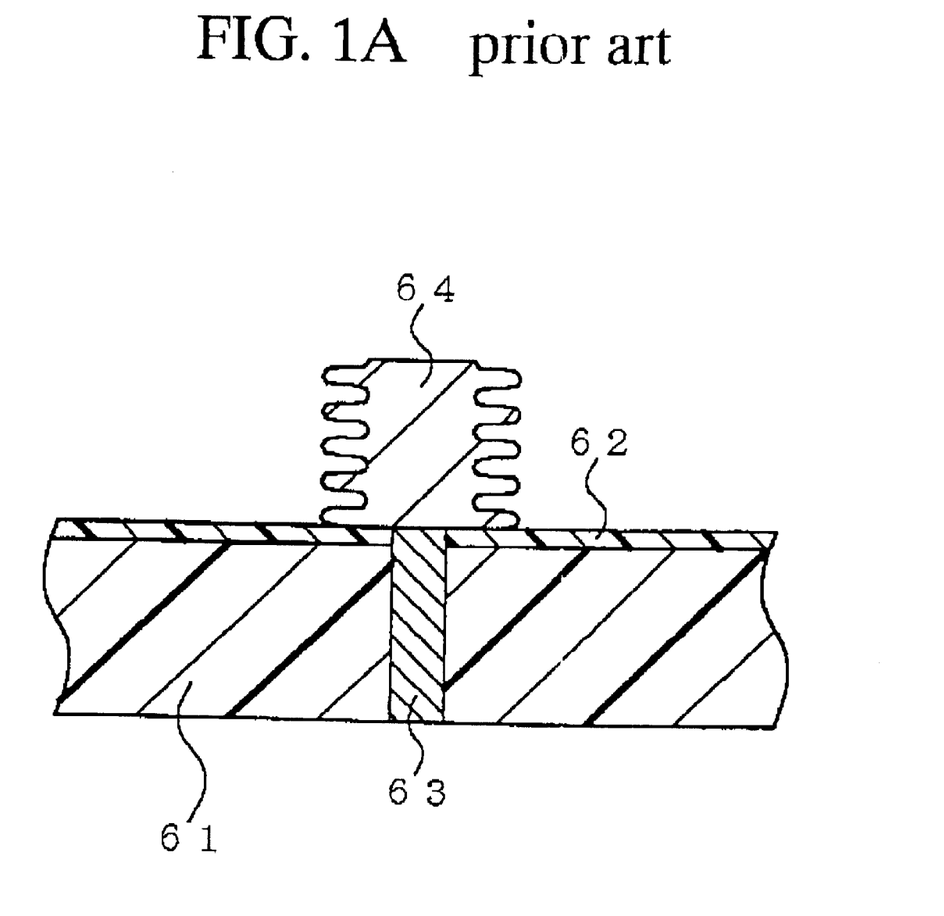
FIGS. 1A and 1B are fragmentary cross sectional elevation views illustrative of bottom electrodes of storage capacitors over base insulating films in sequential steps involved in a conventional method.
Figure 1B:
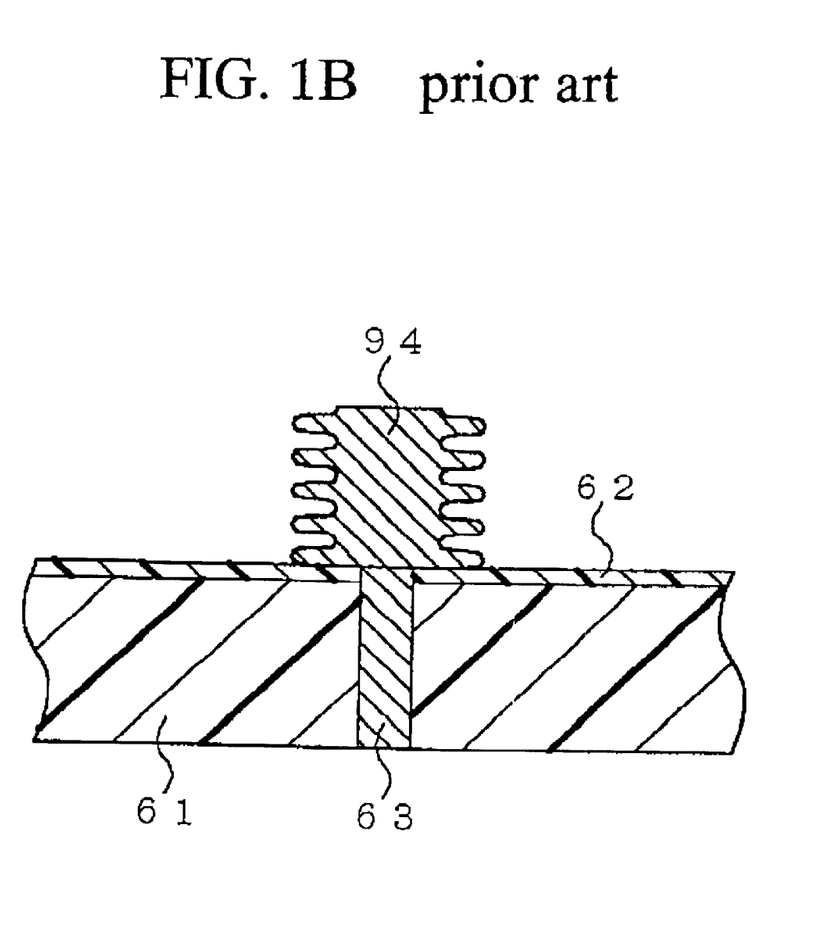

FIGS. 1A and 1B are fragmentary cross sectional elevation views illustrative of bottom electrodes of storage capacitors over base insulating films in sequential steps involved in a conventional method.

With reference to FIG. 1A, an etching stopper film 62 is formed over an upper surface of a base insulating film 61. A hole is formed in a base insulating film 61. A polysilicon contact plug 63 is filled into the hole of the base insulating film 61. A silicon electrode is formed over the etching stopper film 62 over the base insulating film 61, wherein a bottom of the silicon electrode is in contact with the top of the polysilicon contact plug 63. Further, hemi-spherical grains are formed on a surface of the silicon electrode to form a silicon stack electrode 64.

With reference to FIG. 1B, the silicon stack electrode 64 is exposed to a $WF_6$ gas to substitute the hemi-spherical grains into tungsten W, whereby a tungsten stack electrode 94 is formed.

The above conventional method has the following disadvantages. Available metal is limited into tungsten which may shows a substitutional reaction with silicon ($3Si+2WF_6\rightarrow 2W+3SiF_4$). This reaction causes variation in volume, whereby the surface of the stack electrode 94 is deformed. Even illustration is not omitted, a dielectric film is formed on the deformed surface of the stack electrode 94. The deformed surface of the stack electrode 94 increases a leakage of current of the dielectric film.

In the above circumstances, it had been required to develop a novel method of forming a metal bottom electrode of a storage capacitor in a semiconductor memory device free from the above problem.

SUMMARY OF THE INVENTION

Accordingly, it is an object of the present invention to provide a novel method of forming a metal bottom electrode of a storage capacitor in a semiconductor memory device free from the above problems.

It is a further object of the present invention to provide a novel method of forming a metal bottom electrode of a storage capacitor in a semiconductor memory device, wherein the storage capacitor has a large capacity in a unit area.

It is a still further object of the present invention to provide a novel method of forming a metal bottom electrode of a storage capacitor in a semiconductor memory device, wherein the storage capacitor shows a reduced leakage of current.

It is yet a further object of the present invention to provide a novel method of forming a metal bottom electrode of a storage capacitor in a semiconductor memory device, wherein the metal bottom electrode has a reduced resistivity.

The present invention provides a method of forming an electrode, comprising the steps of: forming a dummy electrode having an uneven side face; forming a template insulating film which completely buries the dummy electrode; removing the dummy electrode with leaving the template insulating film so as to form a hole in the template insulating film, wherein a shape of the uneven side face of the dummy electrode as removed is transferred to an inside wall of the hole; filling a metal film into the hole of the template insulating film, wherein the shape of the uneven inside wall of the hole is transferred to a side face of the metal film; and removing the template insulating film to form a metal electrode with an uneven side face.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

The present invention provides a method of forming an electrode, comprising the steps of: forming a dummy electrode having an uneven side face; forming a template insulating film which completely buries the dummy electrode; removing the dummy electrode with leaving the template insulating film so as to form a hole in the template insulating film, wherein a shape of the uneven side face of the dummy electrode as removed is transferred to an inside wall of the hole; filling a metal film into the hole of the template insulating film, wherein the shape of the uneven inside wall of the hole is transferred to a side face of the metal film; and removing the template insulating film to form a metal electrode with an uneven side face.

It is preferable that the template insulating film comprises a silicon dioxide film, and the dummy electrode comprises an amorphous silicon film.

It is further preferable that the dummy electrode is removed by a wet etching process which uses an etchant having a high selectivity of the dummy electrode to the template insulating film.

It is further more preferable that the etchant comprises a mixing solution of a nitric acid and a fluorine acid.

It is also preferable that the metal film is formed by the steps of: carrying out a chemical vapor deposition to entirely deposit the metal film not only within the hole of the template insulating film but also on an upper surface of the template insulating film; and selectively removing the metal film over the template insulating film except within the hole to leave the metal film only within the hole.

It is further preferable that the metal film is selectively removed by an etch-back process.

It is also preferable that the metal film is selectively removed by a chemical mechanical polishing method.

It is also preferable that the metal film is formed by the step of: carrying out an electroless plating method to deposit the metal film only within the hole.

It is further preferable that a barrier metal film is formed on a bottom of the hole before the metal film is selectively deposited within the hole by the electroless plating method.

It is also preferable that the barrier metal film is formed on a top of a contact plug.

PREFERRED EMBODIMENT

First Embodiment

Figure 2A:
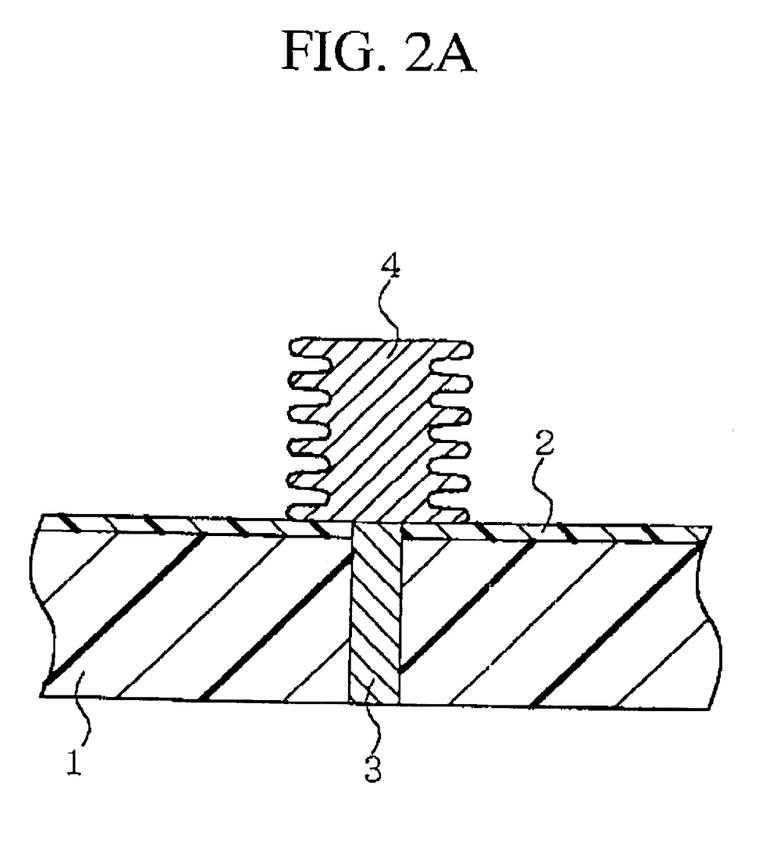
FIGS. 2A and 2E are fragmentary cross sectional elevation views illustrative of bottom electrodes of storage capacitors over base insulating films in sequential steps involved in a first novel method in a first embodiment in accordance with the present invention.

A first embodiment according to the present invention will be described in detail with reference to the drawings. FIGS. 2A and 2E are fragmentary cross sectional elevation views illustrative of bottom electrodes of storage capacitors over base insulating films in sequential steps involved in a first novel method in a first embodiment in accordance with the present invention.

With reference to FIG. 2A, an etching stopper film 2 is formed over an upper surface of a base insulating film 1. A hole is formed in the base insulating film 1. A polysilicon contact plug 3 is filled into the hole of the base insulating film 1. An amorphous silicon electrode is formed over the etching stopper film 2 over the base insulating film 1, wherein a bottom of the silicon electrode is in contact with the top of the polysilicon contact plug 3. Further, hemispherical grains are formed on a surface of the silicon electrode to form a silicon stack electrode 4.

Figure 2B:
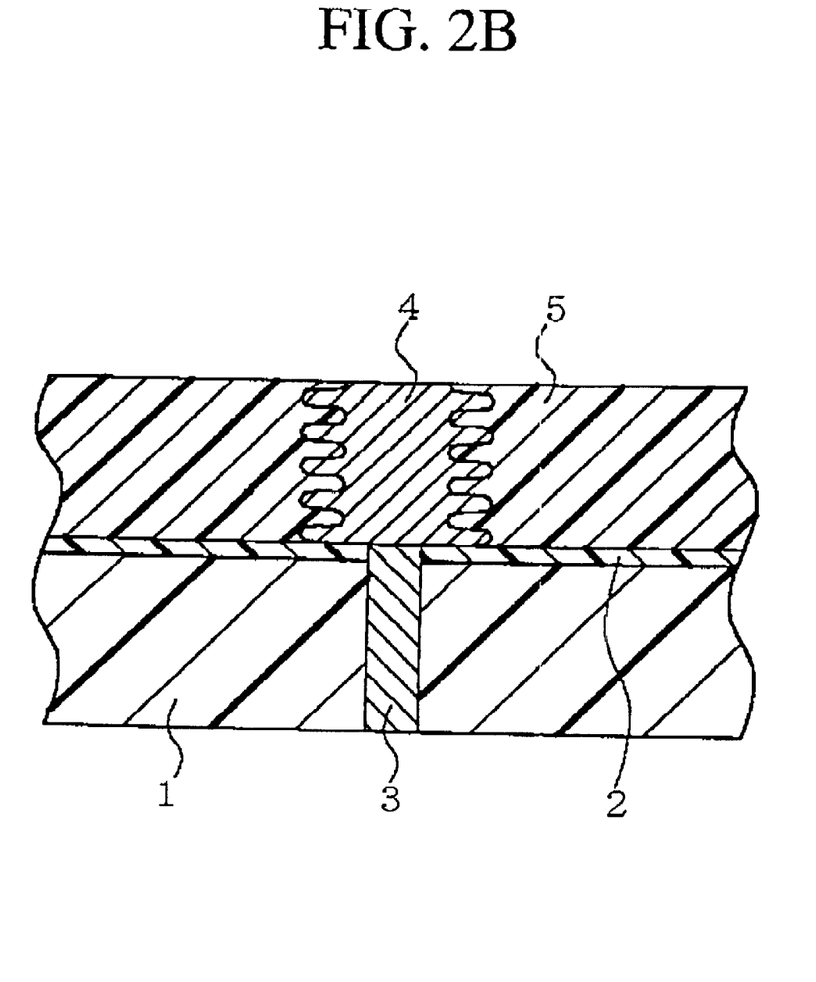

With reference to FIG. 2B, a silicon oxide film 5 is entirely formed by a chemical vapor deposition or a spin coating method over the etching stopper film 2, so that the silicon stack electrode 4 is completely buried in the silicon oxide film 5. An upper region of the silicon oxide film 5 is removed by a chemical mechanical polishing method or an etch-back process such as a dry etching process, so that the top of the silicon stack electrode 4 is shown, and the top surface of the silicon oxide film 5 is palatalized to the top of the silicon stack electrode 4.

Figure 2C:
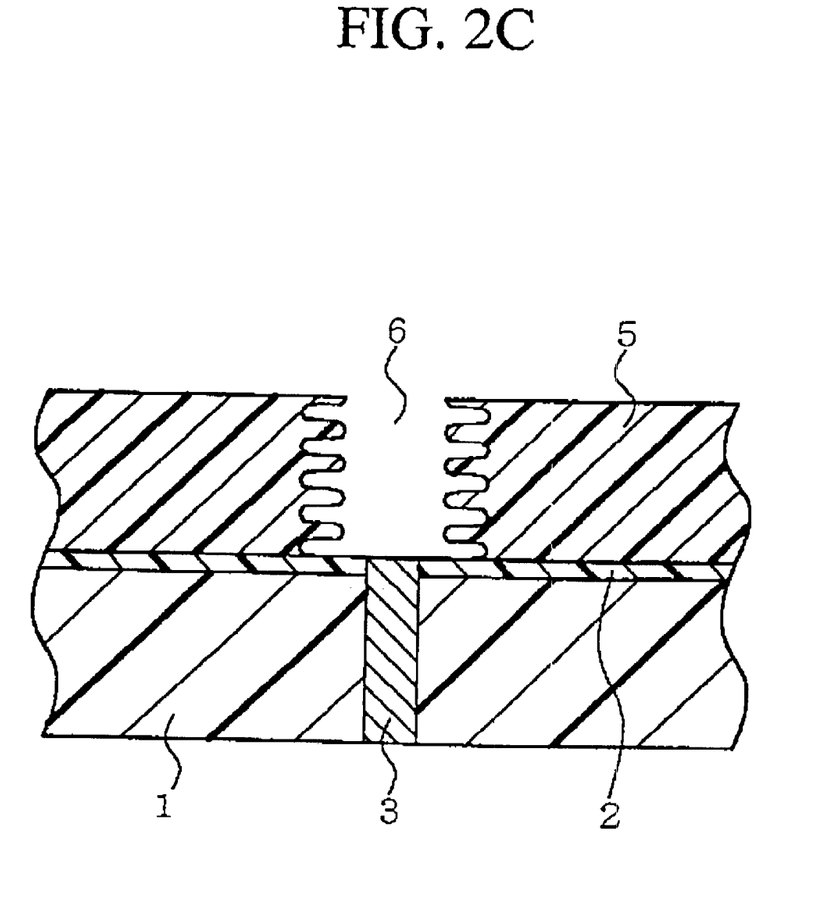

With reference to FIG. 2C, the silicon stack electrode 4 is removed by a wet etching method using an etchant having a high etching selectivity of the silicon stack electrode 4 to the silicon oxide film 5, so that a hole 6 is formed in the silicon oxide film 5. An available etchant may, for example, be a mixing solution of a nitric acid and a fluorine acid. As a result, a shape of the uneven surface of the silicon stack electrode 4 is transferred to an inner wall of the hole 6 of the silicon oxide film 5.

Figure 2D:
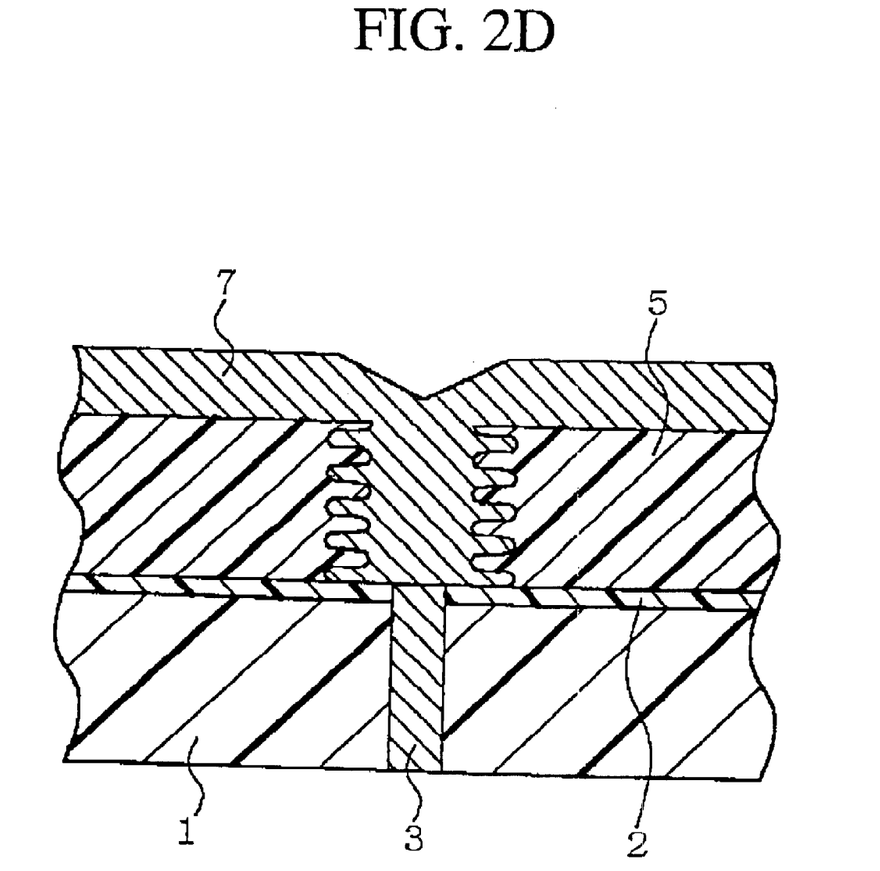
Figure 2E:
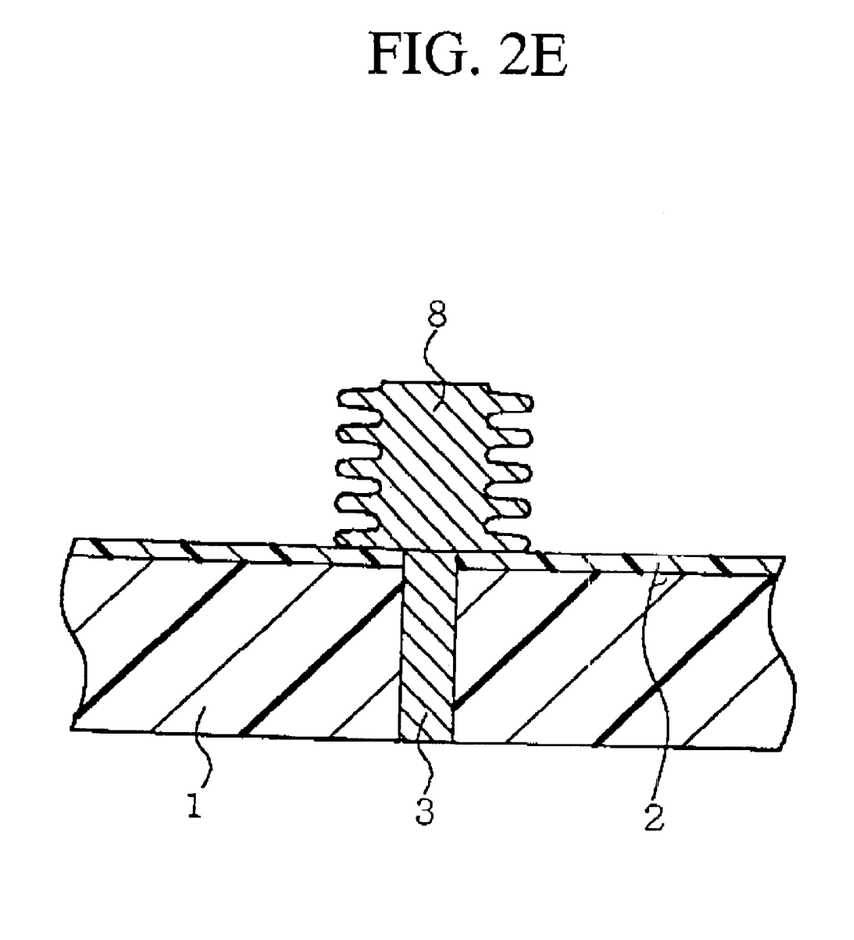

With reference to FIG. 2D, a metal film 7 is entirely deposited by a chemical vapor deposition method over the silicon oxide film 5 and also within the hole 6 of the silicon oxide film 5. The metal film 7 may be made of a metal such as W, Ru, and Pt. As a result, the shape of the right surface of the inner wall of the hole 6 of the silicon oxide film 5 is also transferred into the side face of the lower portion of the metal film 7 in the hole 6.

With reference to FIG. 2E, an upper portion of the metal film 7 over the top surface of the silicon oxide film 5 is removed by the chemical mechanical polishing method, so that the metal film 7 remains only within the hole 6 of the silicon oxide film 5. Subsequently, the silicon oxide film 5 is removed by a wet etching process, whereby the remaining metal film 7 serves as a metal bottom electrode 8 of a storage capacitor. The metal bottom electrode 8 has an uneven side face which has been transferred from the uneven surface of the inner wall of the hole of the removed silicon oxide film 5.

The above first novel method has the following advantages. The above first novel method utilizes the additional insulating film as a template to the uneven surface of the bottom electrode without, however, utilizing any chemical reaction such as the substitutional reaction. For this reason, available metals are not limited into tungsten. Namely, not only tungsten but also other metals such as Ru or Pt are available. This first novel method causes no variation in volume, whereby the surface of the bottom electrode 8 is not deformed. Even illustration is not omitted, a dielectric film is formed on the highly accurate uneven surface free of any deformation of the bottom electrode 8. The deformation-free uneven surface of the bottom electrode 8 reduces a leakage of current of the dielectric film.

If the bottom electrode is made of Ru and the dielectric film on the surface of the bottom electrode is made of $Ta_2O_5$, then an obtained capacity is 0.35 nm in thickness equivalent for silicon dioxide (teq). If the bottom electrode is made of Ru and the dielectric film on the surface of the bottom electrode is made of BST (Ba, St, Ti), then an obtained capacity is 0.2 nm in thickness equivalent for silicon dioxide (teq).

Second Embodiment

Figure 3A:
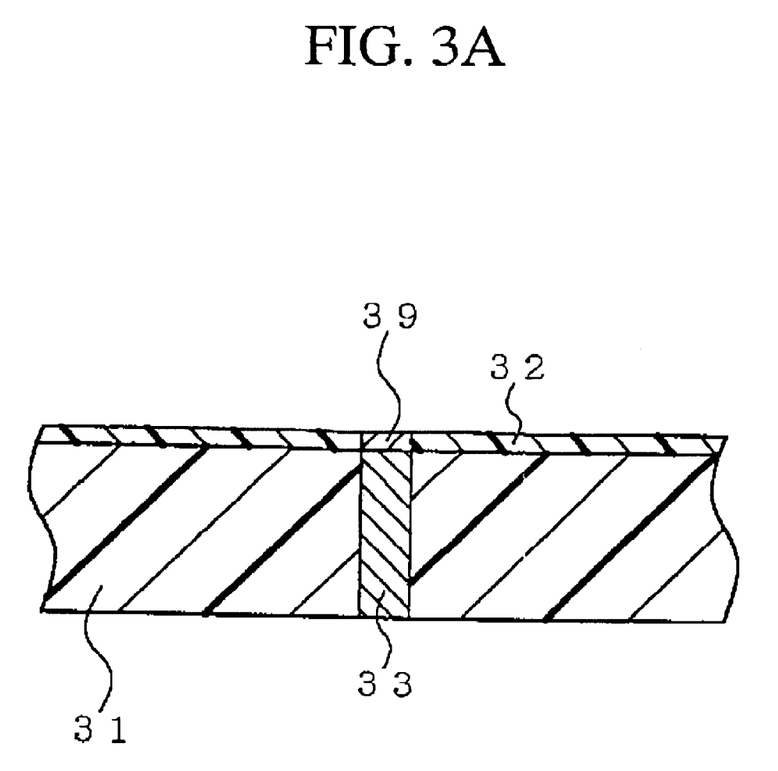
FIGS. 3A and 3F are fragmentary cross sectional elevation views illustrative of bottom electrodes of storage capacitors over base insulating films in sequential steps involved in a second novel method in a second embodiment in accordance with the present invention.

A second embodiment according to the present invention will be described in detail with reference to the drawings. FIGS. 3A and 3F are fragmentary cross sectional elevation views illustrative of bottom electrodes of storage capacitors over base insulating films in sequential steps involved in a second novel method in a second embodiment in accordance with the present invention.

With reference to FIG. 3A, an etching stopper film 32 is formed over an upper surface of a base insulating film 31. A hole is formed in the base insulating film 31. A polysilicon contact plug 33 is filled into the hole of the base insulating film 31. A barrier metal 39 is formed on the top of the polysilicon plug 33. The barrier metal 39 may be made of TiN or TaN.

Figure 3B:
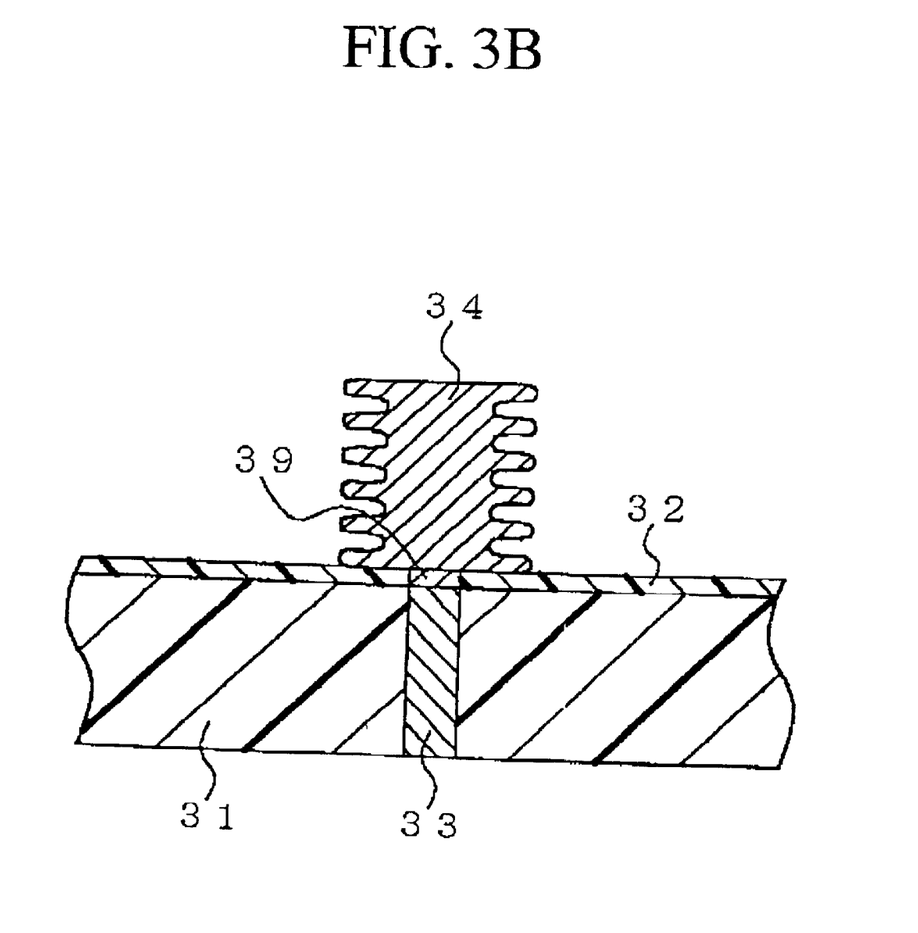

With reference to FIG. 3B, an amorphous silicon electrode is formed over the etching stopper film 32 over the base insulating film 31, wherein a bottom of the silicon electrode is in contact with the barrier metal 39 on the top of the polysilicon contact plug 33. Further, hemi-spherical grains are formed on a surface of the silicon electrode to form a silicon stack electrode 34.

Figure 3C:
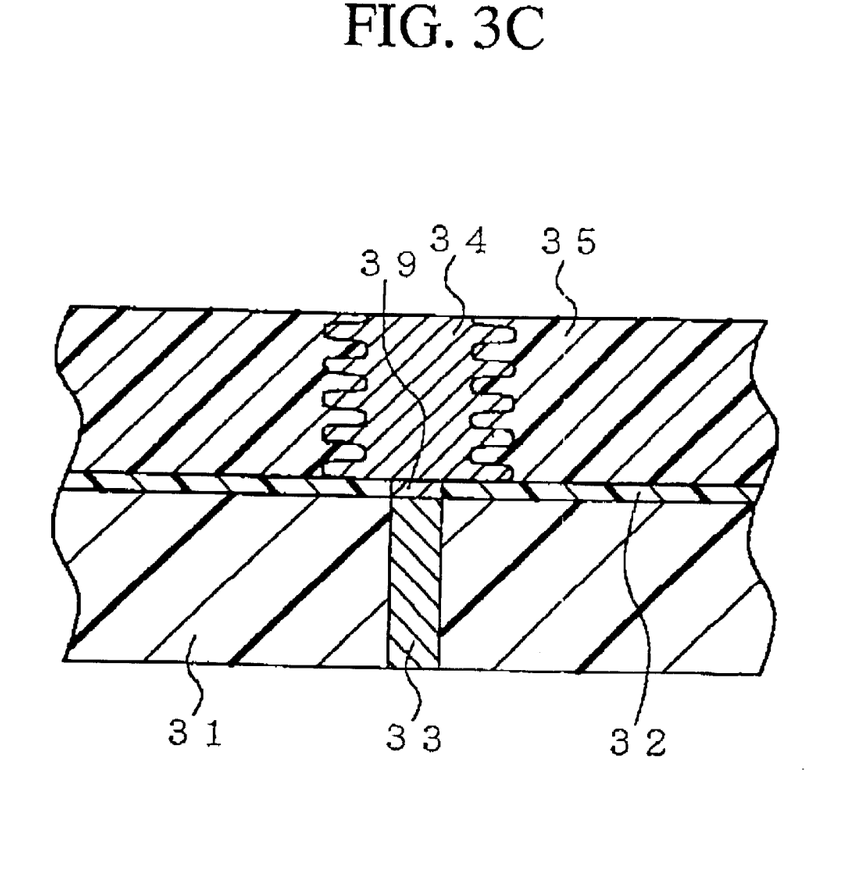

With reference to FIG. 3C, a silicon oxide film 35 is entirely formed by a chemical vapor deposition or a spin coating method over the etching stopper film 32, so that the silicon stack electrode 34 is completely buried in the silicon oxide film 35. An upper region of the silicon oxide film 35 is removed by a chemical mechanical polishing method or an etch-back process such as a dry etching process, so that the top of the silicon stack electrode 34 is shown, and the top surface of the silicon oxide film 35 is palatalized to the top of the silicon stack electrode 34.

Figure 3D:
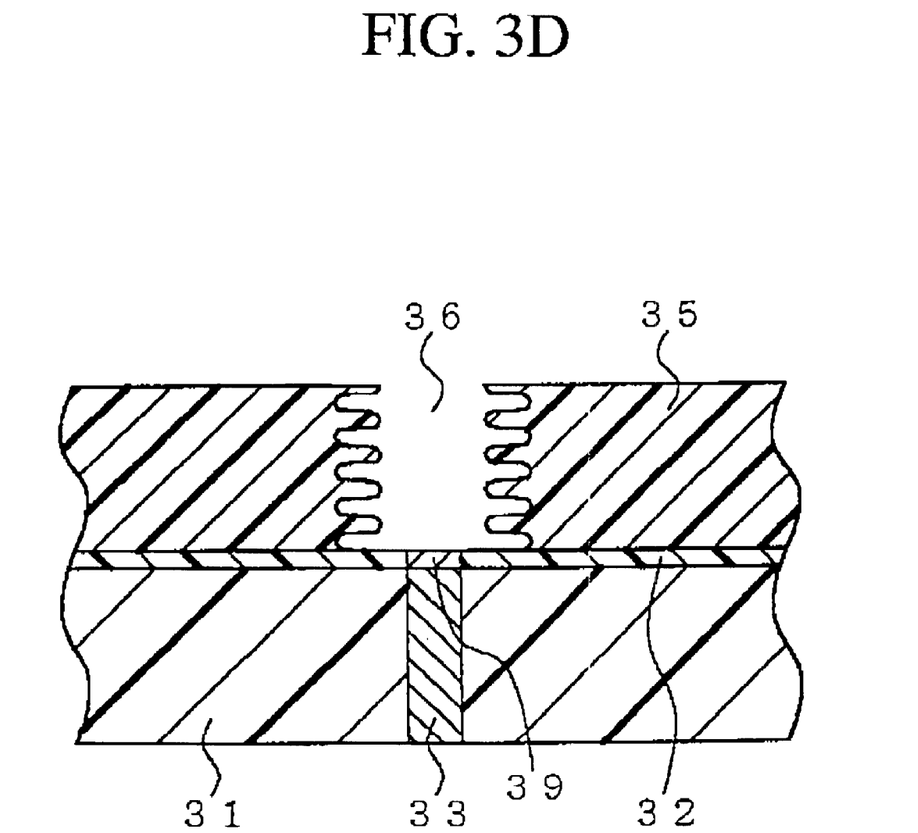

With reference to FIG. 3D, the silicon stack electrode 34 is removed by a wet etching method using an etchant having a high etching selectivity of the silicon stack electrode 34 to the silicon oxide film 35, so that a hole 36 is formed in the silicon oxide film 35. An available etchant may, for example, be a mixing solution of a nitric acid and a fluorine acid. As a result, a shape of the uneven surface of the silicon stack electrode 34 is transferred to an inner wall of the hole 36 of the silicon oxide film 35.

Figure 3E:
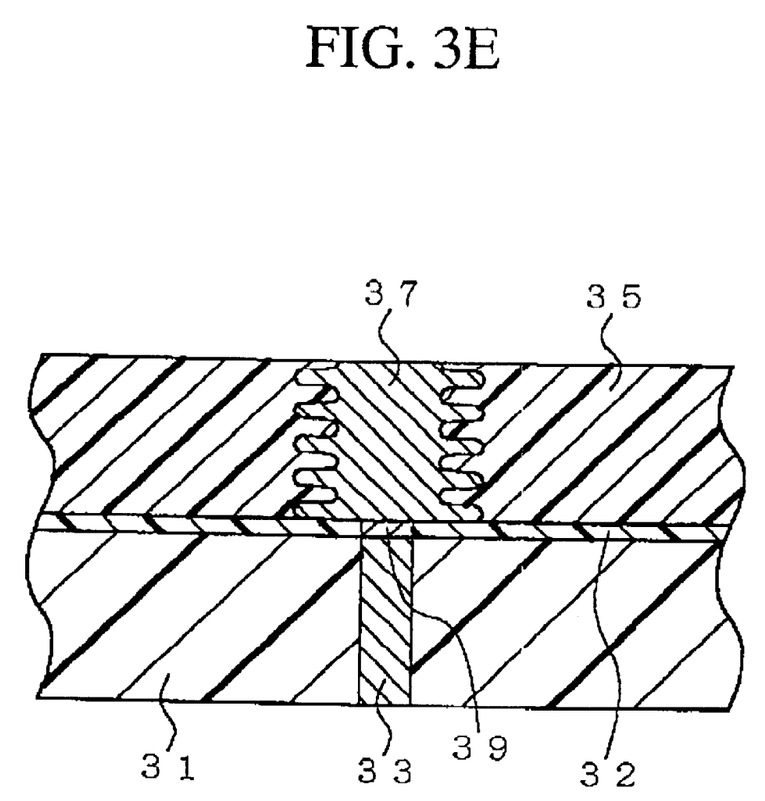
Figure 3F:
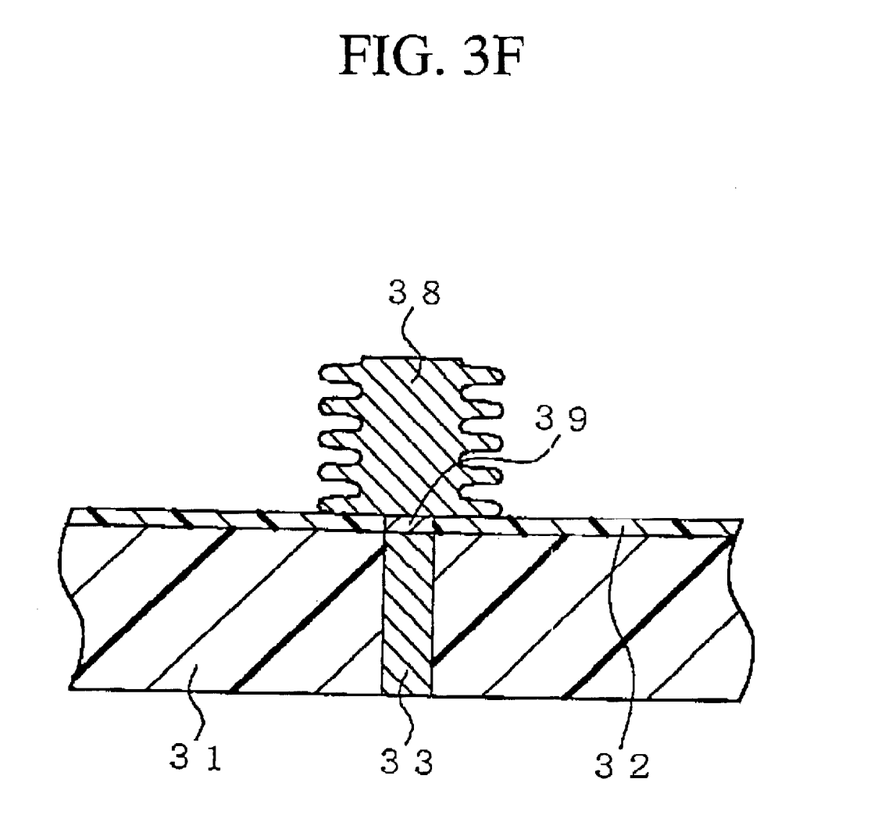

With reference to FIG. 3E, a metal film 37 is formed by an electroplating method by use of the barrier metal as a seed, so that the metal film 37 fills the hole 36 of the silicon oxide film 35. The metal film 37 may be made of a metal such as W, Ru, and Pt. As a result, the shape of the right surface of the inner wall of the hole 36 of the silicon oxide film 35 is also transferred into the side face of the lower portion of the metal film 37 in the hole 36.

With reference to FIG. 3F, the silicon oxide film 35 is removed by a wet etching process, whereby the remaining metal film 37 serves as a metal bottom electrode 38 of a storage capacitor. The metal bottom electrode 38 has an uneven side face which has been transferred from the uneven surface of the inner wall of the hole of the removed silicon oxide film 38.

The above second novel method has the following advantages. The above second novel method utilizes the additional insulating film as a template to the uneven surface of the bottom electrode without, however, utilizing any chemical reaction such as the substitutional reaction. For this reason, available metals are not limited into tungsten. Namely, not only tungsten but also other metals such as Ru or Pt are available. This second novel method causes no variation in volume, whereby the surface of the bottom electrode is not deformed. Even illustration is not omitted, a dielectric film is formed on the highly accurate uneven surface free of any deformation of the bottom electrode. The deformation-free uneven surface of the bottom electrode reduces a leakage of current of the dielectric film.

If the bottom electrode is made of Ru and the dielectric film on the surface of the bottom electrode is made of $Ta_2O_5$, then an obtained capacity is 0.35 nm in thickness equivalent for silicon dioxide (teq). If the bottom electrode is made of Ru and the dielectric film on the surface of the bottom electrode is made of BST (Ba, St, Ti), then an obtained capacity is 0.2 nm in thickness equivalent for silicon dioxide (teq).

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A method of forming an electrode, comprising the steps of:

forming a dummy electrode having an uneven side face;

forming a template insulating film which completely buries the dummy electrode;

removing said dummy electrode with leaving said template insulating film so as to form a hole in said template insulating film, wherein a shape of the uneven side face of the dummy electrode as removed is transferred to an inside wall of the hole;

filling a metal film into said hole of said template insulating film, wherein the shape of the uneven inside wall of said hole is transferred to a side face of the metal film; and removing said template insulating film to form a metal electrode with an uneven side face.

2. The method as claimed in claim 1, wherein said template insulating film comprises a silicon dioxide film, and the dummy electrode comprises an amorphous silicon film.

3. The method as claimed in claim 2, wherein said dummy electrode is removed by a wet etching process which uses an etchant having a high selectivity of the dummy electrode to said template insulating film.

4. The method as claimed in claim 3, wherein said etchant comprises a mixing solution of a nitric acid and a fluorine acid.

5. The method as claimed in claim 1, wherein said metal film is formed by the steps of:

carrying out a chemical vapor deposition to entirely deposit the metal film not only within the hole of the template insulating film but also on an upper surface of the template insulating film; and selectively removing the metal film over the template insulating film except within the hole to leave the metal film only within the hole.

6. The method as claimed in claim 5, wherein the metal film is selectively removed by an etch-back process.

7. The method as claimed in claim 5, wherein the metal film is selectively removed by a chemical mechanical polishing method.

8. The method as claimed in claim 1, wherein said metal film is formed by the step of: carrying out an electroless plating method to deposit the metal film only within the hole.

9. The method as claimed in claim 8, wherein a barrier metal film is formed on a bottom of the hole before the metal film is selectively deposited within the hole by the electroless plating method.

10. The method as claimed in claim 9, wherein the barrier metal film is formed on a top of a contact plug.

* * * * *